(12) United States Patent
Ikarashi et al.

(10) Patent No.: US 8,680,502 B2
(45) Date of Patent: Mar. 25, 2014

(54) AMORPHOUS SEMICONDUCTOR LAYER MEMORY DEVICE

(75) Inventors: Minoru Ikarashi, Kanagawa (JP); Katsuhisa Aratani, Aichi (JP)

(73) Assignee: Sony Corporation, Tokyo (JP)

( * ) Notice: Subject to any disclaimer, the term of this patent is extended or adjusted under 35 U.S.C. 154(b) by 288 days.

(21) Appl. No.: 13/197,814

(22) Filed: Aug. 4, 2011

(65) Prior Publication Data
US 2012/0037873 A1 Feb. 16, 2012

(30) Foreign Application Priority Data

Aug. 11, 2010 (JP) ................................. 2010-180489

(51) Int. Cl.
*H01L 45/00* (2006.01)

(52) U.S. Cl.
USPC .................. 257/3; 257/E45.002; 257/2; 257/4

(58) Field of Classification Search
CPC  G11C 2013/009; H01L 45/143; H01L 45/14; H01L 45/141; H01L 45/144
USPC ........................................ 257/3, E45.002, 2, 4
See application file for complete search history.

(56) References Cited

U.S. PATENT DOCUMENTS 6,849,868 B2 * 2/2005 Campbell ........................ 257/35
2009/0233422 A1 * 9/2009 Krieger et al. ................. 438/478

OTHER PUBLICATIONS

S. Hudgens and B. Johnson; Overview of Phase-Change Chalcogenide Nonvolatile Memory Technology; MRS Bulletin; p. 829; Nov. 2004.

* cited by examiner

*Primary Examiner* — Jerome Jackson, Jr.
*Assistant Examiner* — Paul Budd
(74) *Attorney, Agent, or Firm* — Dentons US LLP

(57) ABSTRACT

A memory device includes: first and second electrodes; a semiconductor layer of a first conduction type provided on the first electrode side; a solid electrolyte layer containing movable ions and provided on the second electrode side; and an amorphous semiconductor layer of a second conduction type which is provided between the semiconductor layer and the solid electrolyte layer so as to be in contact with the solid electrolyte layer and, at the time of application of voltage to the first and second electrodes, reversibly changes to the first conduction type.

12 Claims, 7 Drawing Sheets

AMORPHOUS SEMICONDUCTOR LAYER MEMORY DEVICE

BACKGROUND

The present disclosure relates to a memory device to/from which information is written/erased by a change in a conduction type of an amorphous semiconductor layer.

With the dramatic spread of small devices for individuals such as information communication devices and, particularly, portable devices, elements such as memories and logics constructing the devices are demanded to achieve higher performances such as higher integration, higher speed, and lower power. A nonvolatile memory such as a semiconductor flash memory or an FeRAM (Ferroelectric Random Access Memory) is being actively studied and developed for further higher performances.

In recent years, one of nonvolatile memories which are regarded as promising ones is a phase-change memory (refer to, for example, S. Hudgens, et al., "Overview of Phase-Change Chalcogenide Nonvolatile Memory Technology", MRS BULLETIN, NOVEMBER 2004, p. 829). A phase-change memory has a chalcogenide semiconductor layer between two electrodes one of which is connected to a selection diode or a selection transistor, and a part of the chalcogenide semiconductor layer is in contact with one of the electrodes. In the interface with the electrode, the chalcogenide semiconductor layer changes from a crystal state of low electric resistance to an amorphous state of high electric resistance or from the amorphous state to the crystal state by generation of Joule heat. When the crystal state is set as "1" and the amorphous state is set as "0", by reading the change in the resistance state, "1" and "0" can be discriminated from each other. A resistance value histogram corresponding to the state of "1" and that corresponding to the state of "0" are a resistance separation characteristic which is an important characteristic to increase memory performance.

An amorphous chalcogenide used for a phase-change memory is glass containing a chalcogen element (S, Se, Te) and its representative one is $Ge_2Sb_2Te_5$ or the like. Glass and an amorphous material are almost equivalent terms. Both of them are solids but do not have the long-range order of a crystal structure unlike liquids. A material having no clear glass-transition point is defined here as an amorphous material.

A phase transition between the amorphous state and the crystal state in the chalcogenide semiconductor layer always accompanies latent heat and is therefore classified as a so-called phase transition of the first kind. The phase transition of the first kind defined here relates to the case where the first order differential (the following expression (1)) of the Gibbs free energy G is discontinuous. In this case, discontinuity occurs in volume or enthalpy. In the expression (1), p denotes pressure of a system, and T indicates absolute temperature of the system. Latent heat necessary for the phase transition of the first kind is equal to discontinuity in enthalpy and, in a state where the pressure or temperature of the system is constant, endothermic reaction or exothermic reaction occurs.

$$\left(\frac{\partial G}{\partial P}\right)_T \text{ OR } \left(\frac{\partial G}{\partial T}\right)_P \tag{1}$$

SUMMARY

In a phase-change memory based on such phase transition of the first kind, when the chalcogenide semiconductor layer changes from the crystal state to the amorphous state, almost half of input Joule heat is absorbed as latent heat. In other words, in a phase-change memory as a related art, the Joule heat higher than the latent heat has to be generated, and it is difficult to largely reduce power consumption in principle.

In the phase transition of the first kind, temperature rise exceeding the melting point of the chalcogenide semiconductor is necessary. Due to the temperature rise, the material in the periphery of the chalcogenide semiconductor layer is thermally damaged very severely.

Further, the phase transition of the first kind accompanies a large volume change of about a few % corresponding to reconstruction of the crystal state—the amorphous state before and after the phase transition, so that a film peeling phenomenon due to the difference between the thermal expansion coefficient of the chalcogenide semiconductor layer and the thermal expansion coefficient of the electrode occurs. Such a temperature rise and volume change restrict the number of rewriting times and reliability.

It is therefore desirable to provide a memory device achieving low power consumption and high reliability.

A memory device according to an embodiment of the disclosure includes: first and second electrodes; a semiconductor layer of a first conduction type provided on the first electrode side; a solid electrolyte layer containing movable ions and provided on the second electrode side; and an amorphous semiconductor layer of a second conduction type which is provided between the semiconductor layer and the solid electrolyte layer so as to be in contact with the solid electrolyte layer and, at the time of application of voltage to the first and second electrodes, reversibly changes to a first conduction type.

In the memory device, when a predetermined voltage is applied to the first and second electrodes, the movable ions move between the solid electrolyte layer and the amorphous semiconductor layer, and the conduction type of the amorphous semiconductor layer changes. By the change in the resistance value accompanying the change in the conduction type of the amorphous semiconductor layer, data is written/erased.

In the memory device as an embodiment of the disclosure, the conduction type of the amorphous semiconductor layer is changed by application of voltage. Consequently, the electric resistance changes according to the change in the conduction type, a distribution of the high resistance state shifts to a higher resistance side, a distribution of the low resistance state shifts to a lower resistance side, and a high resistance separation characteristic is obtained. Further, the change in the amorphous state does not accompany release/absorption of latent heat and a volume change and is carried out by the phase transition of the second kind which does not need a temperature rise exceeding the melting point of the amorphous semiconductor layer. Therefore, power consumption is reduced, and the reliability improves.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENTS

Embodiments of the present disclosure will be described in detail below with reference to the drawings. The description will be given in the following order.
1. First Embodiment
   A memory device having a semiconductor layer, an amorphous semiconductor layer, and a solid electrolyte layer
2. Modification 1
   The memory device further having a heat barrier layer
3. Second Embodiment
   A memory device having an intrinsic semiconductor layer between a semiconductor layer and an amorphous semiconductor layer 4. Modification 2

The memory device further having a heat barrier layer

First Embodiment

Figure 1:
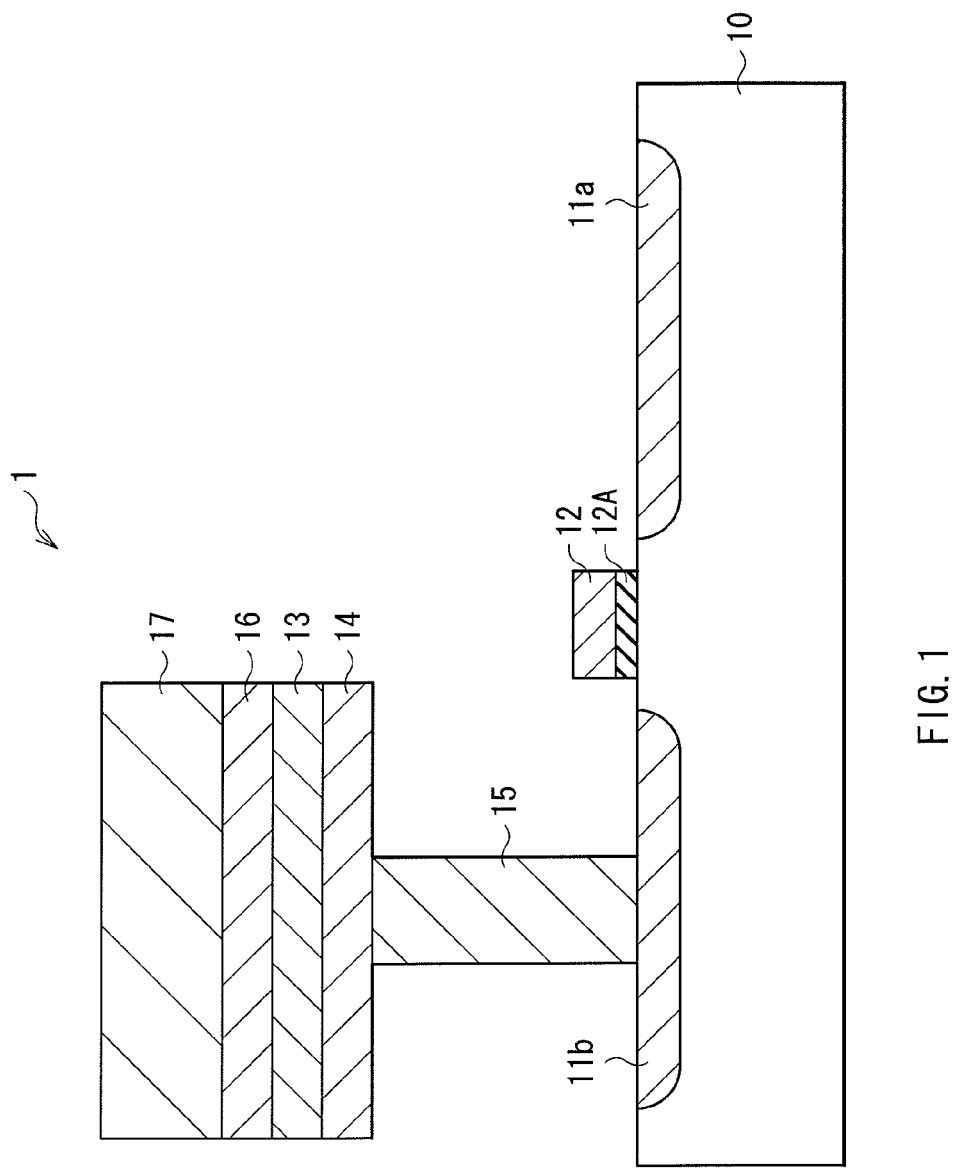
FIG. 1 is a cross section illustrating the configuration of a memory device according to a first embodiment of the present disclosure.

FIG. 1 is a sectional configuration diagram of a memory device 1 according to a first embodiment of the present disclosure. The memory device 1 has a bottom electrode 15 (first electrode), a semiconductor layer 14, an amorphous semiconductor layer 13, a solid electrolyte layer 16, and a top electrode 17 (second electrode) in this order.

The bottom electrode 15 is connected to a corresponding MOS (Metal Oxide Semiconductor) transistor Tr for cell selection. The MOS transistor Tr is constructed by a source region 11a and a drain region 11b formed in a semiconductor substrate 10 and a gate electrode 12 provided over the semiconductor substrate 10 via a gate insulating film 12A. One end of the bottom electrode 15 is connected to, for example, the drain region 11b of the MOS transistor Tr. The bottom electrode 15 is made of a wiring material used for a semiconductor process, such as, W (tungsten), WN (tungsten nitride), TiN (titanium nitride), Cu (copper), Al (aluminum), Mo (molybdenum), Ta (tantalum), or silicide.

One end of the bottom electrode 15 is connected to, for example, a part of the semiconductor layer 14. The semiconductor layer 14 has a conduction type opposite to that of the amorphous semiconductor layer 13 which will be described later. Specifically, when the amorphous semiconductor layer 13 is of the p type, the semiconductor layer 14 is of the n type. When the amorphous semiconductor layer 13 is of the n type, the semiconductor layer 14 is of the p type. The amorphous semiconductor layer 13 and the semiconductor layer 14 have the property of a diode by having opposite conduction types. For example, crystalline silicon (Si) can be used for the semiconductor layer 14. By adding phosphorus (P), arsenic (As), antimony (Sb), bismuth (Bi), or the like as impurity, the semiconductor layer 14 becomes n-type semiconductor. When boron (B), aluminum (Al), or the like is added as an impurity, the semiconductor layer 14 becomes p-type semiconductor. The concentration of the impurity added is desirably equal to or less than trap concentration in the amorphous semiconductor layer 13 so that the width of a depletion layer formed between the semiconductor layer 14 and the amorphous semiconductor layer 13 becomes a proper value. Preferably, the semiconductor layer 14 is made of semiconductor having a dense crystalline structure containing Si (silicon), Ge (germanium), Ga (gallium) element, or the like to prevent the junction plane of the semiconductor layer 14 from being contaminated by movable ions moved from the solid electrolyte layer 16. When the semiconductor layer 14 is made of, for example, crystalline phase semiconductor, the interface with the amorphous semiconductor layer 13 is a heterojunction interface. Consequently, to form a normal heterojunction, the band gap of the semiconductor layer 14 and that of the amorphous semiconductor layer 13 are desirably values which are as close as possible. For example, when crystalline silicon (Si) to which antimony (Sb) is added at a concentration of $10^{17}$ cm$^{-3}$ is used for the n-type semiconductor layer 14, $Ge_{20}Te_{80}$ may be used for the p-type amorphous semiconductor layer 13. The band gap of silicon is about 1.1 eV and that of germanium telluride (GeTe) is about 1 eV.

The amorphous semiconductor layer 13 is formed between the semiconductor layer 14 and the solid electrolyte layer 16 in contact with at least the solid electrolyte layer 16. As the amorphous semiconductor layer 13, it is preferable to use chalcogenide semiconductor containing a chalcogen element such as S (sulfur), Se (selenium), Te (tellurium), or the like or an alloy of the chalcogen element. When movable ions move from the solid electrolyte layer 16 to the amorphous semiconductor layer 13 or from the amorphous semiconductor layer 13 to the solid electrolyte layer 16 as described later, the conduction type of the amorphous semiconductor layer 13 changes reversibly. In the embodiment, by the changes, data is written/erased.

The solid electrolyte layer 16 is provided between the amorphous semiconductor layer 13 and the top electrode 17. The solid electrolyte layer 16 has the function of supplying movable ions to the amorphous semiconductor layer 13 or receiving movable ions from the amorphous semiconductor layer 13. Preferably, the solid electrolyte layer 16 has proper electric conduction property and uses a high-strength high-corrosion-resistance material. For example, a metal glass or metal amorphous material as an alloy whose metal element is a main component is desirable. Particularly, Zr-based metal glass and ZrCuAl-based metal glass have relatively high viscosity and are suitable to finely control a supply amount of movable ions to the amorphous semiconductor layer 13. To facilitate movement of the movable ions to the amorphous semiconductor layer 13, preferably, the property of the solid electrolyte layer 16 and that of the amorphous semiconductor layer 13 as viscous fluids are close to each other. Concretely, in mathematical expression (2) showing a temperature characteristic which determines viscosity η, preferably, activation energy Ea of both of the solid electrolyte layer 16 and the amorphous semiconductor layer 13 is equal to or larger than 2 eV. Here, η0 denotes proportional constant, $k_B$ denotes Boltzmann constant, and T denotes absolute temperature.

$$\eta = \eta_0 \exp\left(\frac{E_a}{k_B T}\right) \quad (2)$$

The movable ion is, preferably, a monoatomic ion having an ion radius which is small enough to pass through between the lattice of the amorphous semiconductor layer 13. For example, in the case of using the amorphous semiconductor layer 13 of the p-type, preferably, the solid electrolyte layer 16 contains any of a monovalent positive ion $H^+$, $Li^+$ (hydron containing $D^+$ and $T^+$), $Na^+$, $K^+$, $Ag^+$, $Cu^+$, $Hg^+$, $Ti^+$, $Rb^+$, or $Cs^+$, a bivalent positive ion $Mg^{2+}$, $Ca^{2+}$, $Sr^{2+}$, $Ba^{2+}$, $Cd^{2+}$, $Ni^{2+}$, $Zn^{2+}$, $Cu^{2+}$, $Hg^{2+}$, $Fe^{2+}$, $Co^{2+}$, $Sn^{2+}$, $Pb^{2+}$, or $Mn^{2+}$, a trivalent positive ion $Al^{3+}$, $Fe^{3+}$, or $Cr^{3+}$, a tetravalent positive ion $Sn^{4+}$, and the like. In addition, for example, in the case of using the amorphous semiconductor layer 13 of the n-type, preferably, the solid electrolyte layer 16 contains any of a monovalent negative ion $H^-$ (hydride), $F^-$, $Cl^-$, $I^-$, a bivalent negative ion $O^{2-}$, $S^{2-}$, and the like. The operation temperature at which ions can move is preferably equal to or higher than 300K, and the concentration of movable ions in the solid electrolyte layer 16 at room temperature is preferably equal to or less than the trap concentration of the amorphous semiconductor layer 13 to prevent, in the manufacturing process, after stacking the solid electrolyte layer 16, the movable ions from being excessively diffused to the amorphous semiconductor layer 13 by annealing process or the like to disturb a change in the conduction type of the amorphous semiconductor layer 13.

For the top electrode 17, the known semiconductor wiring material may be used like for the bottom electrode 15.

In the memory device 1 of the embodiment, when a voltage pulse or current pulse is applied from a not-illustrated power supply (pulse applying section) via the bottom electrode 15 and the top electrode 17, the conduction type of the amorphous semiconductor layer 13 changes. By the change in the conduction type of the amorphous semiconductor layer 13, data is written/erased. In the following, the change in the conduction type in the amorphous semiconductor layer 13 will be described in detail.

The change in the conduction type of the amorphous semiconductor layer 13 is caused by the phase transition of the second kind which occurs between two distinguishable states of the amorphous state. First, the two states existing in the amorphous state will be described.

It is known that the chalcogenide semiconductor containing a chalcogen element (S, Se, Te) or an alloy of the chalcogen element exhibits two kinds of electric switching characteristics (P. G. Le Comber and J. Mort, "Electronic and Structural Properties of Amorphous", Academic Semiconductors press, 1973).

Figure 6:
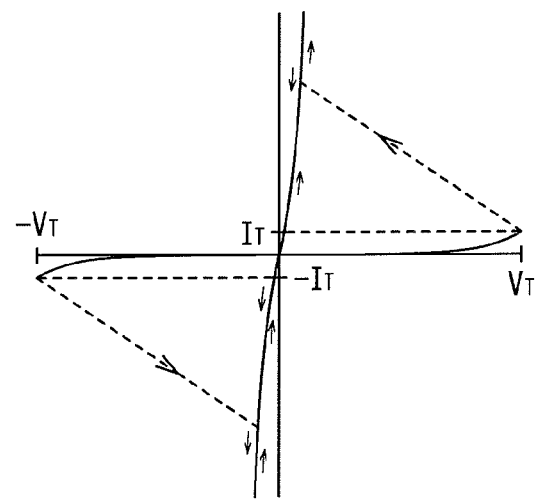
FIG. 6 is a characteristic diagram illustrating characteristics of memory switching.
Figure 7:
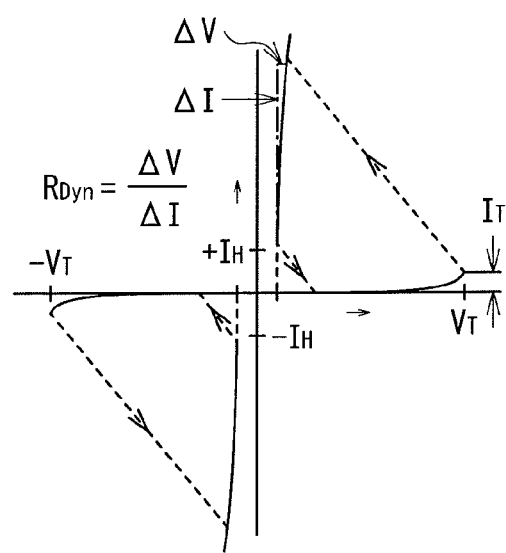
FIG. 7 is a characteristic diagram illustrating characteristics of threshold switching.

One of the two kinds of electric switching characteristics is a voltage-current characteristic called "memory switching" illustrated in FIG. 6. $Ge_2Sb_2Te_5$, $Te_{81}Ge_{51}X_4$, or the like has a soft glass structure and, when application voltage exceeds a threshold voltage $V_{th}$, changes from the amorphous state to the crystal state in very short time. The voltage-current characteristic at this time is "memory switching". On the other hand, $Te_{30}As_{30}Si_{10}Ge_{10}$ or the like has a hard tetrahedral structure, is not easily crystallized, and exhibits a switching phenomenon as illustrated in FIG. 7 in the amorphous state. This is another voltage-current characteristic called "threshold switching".

However, $Ge_2Sb_2Te_5$ which normally exhibits the memory switching also exhibits the threshold switching by sweeping an application voltage in time shorter than the crystallization time. Two amorphous states appearing in the threshold switching, that is, an amorphous state in high resistance and an amorphous state in low resistance relate to the present disclosure. Next, the mechanism that the amorphous state in high resistance and the amorphous state in low resistance appear will be described.

Figure 8:
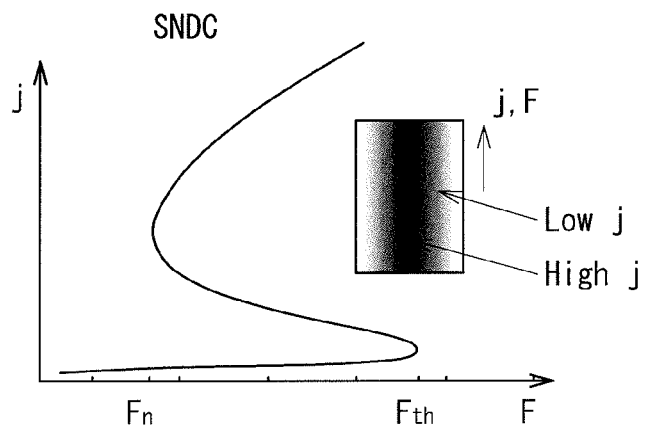
FIG. 8 is a characteristic diagram illustrating negative resistance in an S-shape type.
Figure 9:
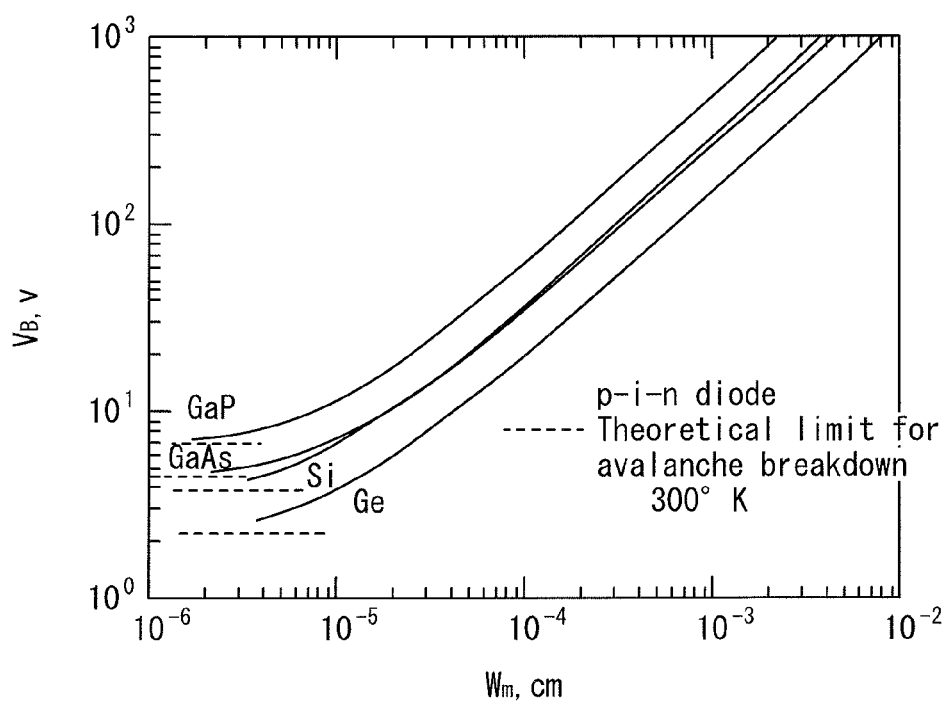
FIG. 9 is a characteristic diagram illustrating threshold voltage $V_{th}$ film thickness dependency of avalanche breakdown.

A sufficient Joule heat is necessary to crystallize $Ge_2Sb_2Te_5$, and high current to generate the Joule heat is passed only in the amorphous state in low resistance. Since a voltage-current characteristic which is seen when the amorphous state in low resistance appears exhibits an S-shaped negative resistance as illustrated in FIG. 8, the current is called an "S-shaped negative current (SNDC)". The SNDC appearing mechanism relates to formation of a coarse/dense distribution of current density called filament and is caused by collisional ionization (E. Scholl, "Non-equilibrium Phase Transition in Semiconductors", Springer-Verlag, 1987). The collisional ionization refers to a phenomenon that carriers accelerated by electric field collide with a lattice and new carriers are created. A phenomenon such that repetition of the collisional ionization starts autocatalytic multiplication of the number of carriers and electric insulation is lost finally is called avalanche breakdown in semiconductor (Y. Okuto, "Threshold energy effect on avalanche breakdown voltage in semiconductor junction", Solid-state Electronics, 18, 161 (1975)). As illustrated in FIG. 9, the threshold voltage $V_{th}$ film thickness dependency of the avalanche breakdown draws a Paschen curve like a low-pressure gas discharge phenomenon.

In a chalcogenide semiconductor, a trap level created by a not-coordinated (dangling bond) lone electron pair in a chalcogen element relates to the collisional ionization. The amorphous state in low resistance is stable only when the electric field is applied and is therefore also called an ionization equilibrium state. Since the chalcogenide semiconductor has two stable amorphous states and the stable states are determined by the electric field, E. Scholl classified the state transition between the amorphous states as a so-called phase transition of the second kind using the electric field as an order parameter. In this case, the phase transition of the second kind refers to a phenomenon that the second order differential (the following expression (3)) of Gibbs free energy G becomes discontinuous. In the expression (3), p denotes pressure of a system and T denotes absolute temperature of the system. All of the structural phase transition, magnetic phase transition, transition from a normal conducting state to a superconducting state, a superfluid state of liquid helium, and the like are the phase transition of the second kind which appears when the order parameter changes from an order state to a disorder state. Since the first order differential of the Gibbs free energy is continuous in the second or higher-order phase transition, latent heat is not generated, and a discontinuous point in specific volume is not also generated. In the present disclosure, the phase transition of the second kind is used as the principle of the resistance change in the memory device, so that release/absorption of the latent heat and a volume change as drawbacks of the memory device which writes/erases data by the phase transition of the first kind are unaccompanied, and a temperature rise exceeding the melting point of the chalcogenide semiconductor is also unnecessary. Next, the reason why the conduction type is changed by the phase transition of the second kind between the two amorphous states will be described.

$$\left(\frac{\partial^2 G}{\partial P^2}\right)_T \quad \text{OR} \quad \left(\frac{\partial^2 G}{\partial T^2}\right)_P \quad (3)$$

When collisional ionization via the trap level occurs in the chalcogenide semiconductor, an original majority carrier (most of the chalcogenide semiconductor are holes) is trapped and cannot move in space. To satisfy an electroneutrality condition, only another carrier (in a chalcogenide semiconductor, in most cases, electron) generated by pair production by the collisional ionization can contribute to current. This is the mechanism of the change in the conduction type between the amorphous state in low resistance and the amorphous state in high resistance. In the case where the majority carrier is an electron, the semiconductor is classified as the n-type semiconductor. In the case where the majority carrier is a hole, the semiconductor is classified as the p-type semiconductor. It is known that, in most cases, the chalcogenide semiconductor is of the p type and, by stacking a silicon semiconductor of the n type, the threshold switching is provided with the diode characteristic (K. E. Petersen, "On state of amorphous threshold switches" J. Appl. Phys., 47, 256 (1976)). Since the amorphous state in high resistance changes to the p type and the amorphous state in low resistance changes to the n type, the diode characteristic appears in the threshold switching.

However, as described above, the amorphous state in low resistance exists stably only when the electric field is applied. When the electric field is set to zero, the amorphous state returns to the amorphous state in high resistance. Consequently, the mechanism cannot be applied as it is to the memory device. The embodiment provides the following mechanism capable of maintaining the amorphous state in low resistance even when the electric field is set to zero.

Figure 2:
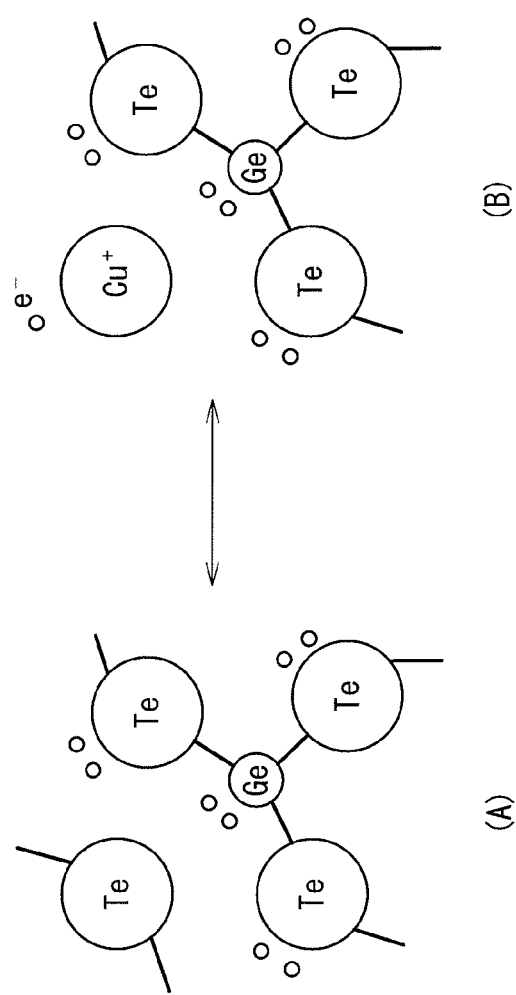
FIG. 2 is a schematic diagram illustrating states of an amorphous semiconductor layer before and after a phase transition of the second kind.

Since the viscosity of the amorphous semiconductor changes according to the composition and temperature, when ions are introduced by electric field acceleration while increasing the temperature of the amorphous semiconductor, a part of a glass network can be substituted with ions (R. Fairman and B. Ushkov, "Semiconducting Chalcogenide Glass", Elsevier Academic press, 2004). Such an ion implantation method is called substitutional doping. The memory device 1 of the embodiment uses the concept of the substitutional doping of forming the amorphous semiconductor layer 13 so as to be in contact with the solid electrolyte layer 16 containing movable ions and introducing the movable ions from the solid electrolyte layer 16 to the amorphous semiconductor layer 13. (A) and (B) of FIG. 2 are schematic diagrams illustrating states of an amorphous semiconductor layer before and after a phase transition of the second kind in the case where the amorphous semiconductor layer 13 is made of GeTe (germanium telluride) and positive ions are $Cu^{2+}$ (copper ions).

In the memory device 1 of the embodiment, as described above, when a voltage pulse or current pulse is applied from the power supply via the bottom electrode 15 and the top electrode 17, movable ions move between the solid electrolyte layer 16 and the amorphous semiconductor layer 13. By the movement, the conduction type of the amorphous semiconductor layer 13 changes, a depletion layer between the semiconductor layer 14 and the amorphous semiconductor layer 13 is formed or disappears, and data is written or erased. In the following, the amorphous state in high resistance of the amorphous semiconductor layer 13 is defined as a reset state, the amorphous state in low resistance is defined as a set state, and the operation will be described concretely.

For example, the amorphous semiconductor layer 13 is made of a chalcogenide semiconductor of the p type, the semiconductor layer 14 is made of a silicon semiconductor of the n type, and positive voltage is applied to the memory device 1 so that, for example, the top electrode 17 has the positive potential and the bottom electrode 15 has the negative potential. In such a manner, Joule heat is generated in the amorphous semiconductor layer 13, temperature rises, and positive ions are supplied by the electric field acceleration from the solid electrolyte layer 16 to the amorphous semiconductor layer 13. When the positive ions are injected from the solid electrolyte layer 16 to the chalcogenide semiconductor layer of the p type by the electric field acceleration, a part of a not-coordinated lone electron pair in the chalcogen element is used to trap the positive ions, and the conduction type of the amorphous semiconductor layer 13 changes to the n type. In other words, in the set state, the conduction type of the amorphous semiconductor layer 13 and that of the semiconductor layer 14 are the same, so that no depletion layer is formed in a junction plane, and the device does not function as a diode.

In the set state, although the resistance value of the amorphous semiconductor layer 13 is originally low, the device does not function as a diode. Consequently, even when the polarity of sense voltage is changed, the distribution of the low-resistance state does not change largely. However, a positive ion distribution in a filament state is formed in the film thickness direction of the amorphous semiconductor layer 13, and a considerable number of electrons exist in the conduction band to satisfy the number of ions charged positively and the electric neutralization condition, so that the resistance distribution in the set state slightly shifts to the low resistance side.

To make the phase transition of the second kind in which the conduction type changes as described above occur, first, when the amorphous semiconductor layer 13 is of the p type, the solid electrolyte layer 16 has to contain movable positive ions. When the amorphous semiconductor layer 13 is of the n type, the solid electrolyte layer 16 has to contain movable negative ions. Further, by the movement of the movable ions, the trap concentration in the amorphous semiconductor layer 13 has to be equal to or higher than donor concentration or acceptor concentration. An amorphous semiconductor containing a chalcogen element or an alloy of the chalcogen element has many not-coordinated lone electron pairs and has excellent property to trap atoms of a different kind, so that it is preferable for the amorphous semiconductor layer 13. For example, germanium telluride ($Ge_xTe_{100-x}$) may be used for the amorphous semiconductor layer 13. In this case, when atomic percent of Ge atoms is X(at %), more preferably, X is in the range of 10 at % to 60 at % both inclusive.

For example, when $Ge_2Sb_2Te_5$ is used for the amorphous semiconductor layer 13, it is estimated that the trap concentration is $10^{21}$ cm$^{-3}$ and the donor concentration and acceptor concentration is about $10^{17}$ to $10^{19}$ cm$^{-3}$ (A. Pirovano, "Electronic Switching in PCM", Trans. Electron. Devices, 51, 452 (2004)). The concentration of positive ions introduced from the solid electrolyte layer 16 has to be equal to or higher than 0.01 to 1% of the trap concentration.

On the other hand, in the reset state, the not-coordinated lone electron pairs of the chalcogen element form a glass network or are used to trap holes as the major carrier. The conduction type of the amorphous semiconductor layer 13 becomes the p type, and the conduction type of the amorphous semiconductor layer 13 and that of the semiconductor layer 14 are different from each other, so that a depletion layer is formed in the junction plane between the amorphous semiconductor layer 13 and the semiconductor layer 14, and the device functions as a diode having a pn junction.

In the reset state, the resistance value of the amorphous semiconductor layer 13 is high and, in addition, the resistance value is detected by adding a sense voltage in a direction of reversely biasing the pn junction, thereby shifting the resistance distribution in the reset state further to the high resistance side. In other words, in the reset state, the distribution in the high-resistance state of the memory device 1 is shifted to a higher resistance side. In the set state, the distribution in the low-resistance state is shifted to a lower resistance side. Thus, a high resistance separation characteristic is obtained.

The amorphous semiconductor layer 13 is preferably made of a material which is not easily crystallized in order to prevent occurrence of the phase transition of the first kind before the phase transition of the second kind occurs or simultaneous occurrence of the phase transitions of the second and first kinds in the amorphous semiconductor layer 13. The phase transition of the second kind may be caused in time shorter than crystallization time necessary to cause the phase transition of the first kind in the amorphous semiconductor layer 13, or the phase transition of the first kind may be prevented by generating heat so that temperature rise stops at a temperature sufficiently lower than the crystallization temperature or the melting point. Since the phase transition of the second kind which changes the conduction type has to occur after avalanche breakdown in the amorphous semiconductor layer 13, the thickness of the semiconductor layer 14 and the amorphous semiconductor layer 13 is set to the device length or longer and is equal to or larger than 2 nm at which carriers do not pass by the tunnel effect.

A method of manufacturing the memory device 1 of the embodiment will be described below.

First, on the substrate 10 in which a CMOS circuit of a selection transistor or the like is formed, the bottom electrode 15 made of, for example, titanium nitride is formed. After that, an oxide or the like on the surface of the bottom electrode 15 is removed by inverse sputtering as necessary. Subsequently, the semiconductor layer 14 of the n type made of crystalline silicon (Si) to which antimony (Sb) is added at a concentration of $10^{17}$ $cm^{-3}$ is formed to a thickness of about 100 nm. After that, for example, the amorphous semiconductor layer 13 made of $Ge_{20}Te_{80}$ and having a thickness of 10 nm and the solid electrolyte layer 16 made of $Zr_{20}Cu_{20}Al_{40}$ $(GeTe)_{20}$ and having a thickness of 40 nm are formed in this order continuously by exchanging targets in a sputtering apparatus. An alloy film is simultaneously formed by using a target of an element. Subsequently, the top electrode 17 is formed by using, for example, tungsten, and the surface of the top electrode 17 is etched.

After formation of the top electrode 17, a wiring layer (not illustrated) to be connected to the top electrode 17 is formed, and a contact part for obtaining a common potential to all of the memory devices 1 is connected. After that, post-annealing process is performed on the stacked films. By the operations, the memory device 1 illustrated in FIG. 1 is completed.

In the memory device 1 of the embodiment, the amorphous semiconductor layer 13 is provided between the semiconductor layer 14 and the solid electrolyte layer 16 and movable ions are moved between the amorphous semiconductor layer 13 and the solid electrolyte layer 16, thereby changing the conduction type of the amorphous semiconductor layer 13. By the change in the conduction type, a depletion layer is formed or disappears in the junction plane between the amorphous semiconductor layer 13 and the semiconductor layer 14, and data is written or erased in the memory device 1. By providing the solid electrolyte film 16, even when the electric field is set to zero, the set state is maintained, and the device is allowed to function as a memory device.

With the change in the amorphous semiconductor layer 13, the distribution of the high-resistance state shifts to a higher resistance side, and the distribution of the low-resistance state shifts to a lower resistance side. Therefore, the memory device 1 may have a high resistance separation characteristic. Further, the change in the conduction type in the amorphous semiconductor layer 13 is caused by the phase transition of the second kind which does not accompany release/absorption of latent heat and volume change and does not need a temperature rise exceeding the melting point of the amorphous semiconductor layer. Therefore, power consumption is reduced, and reliability improves.

(Modification 1)

Figure 3:
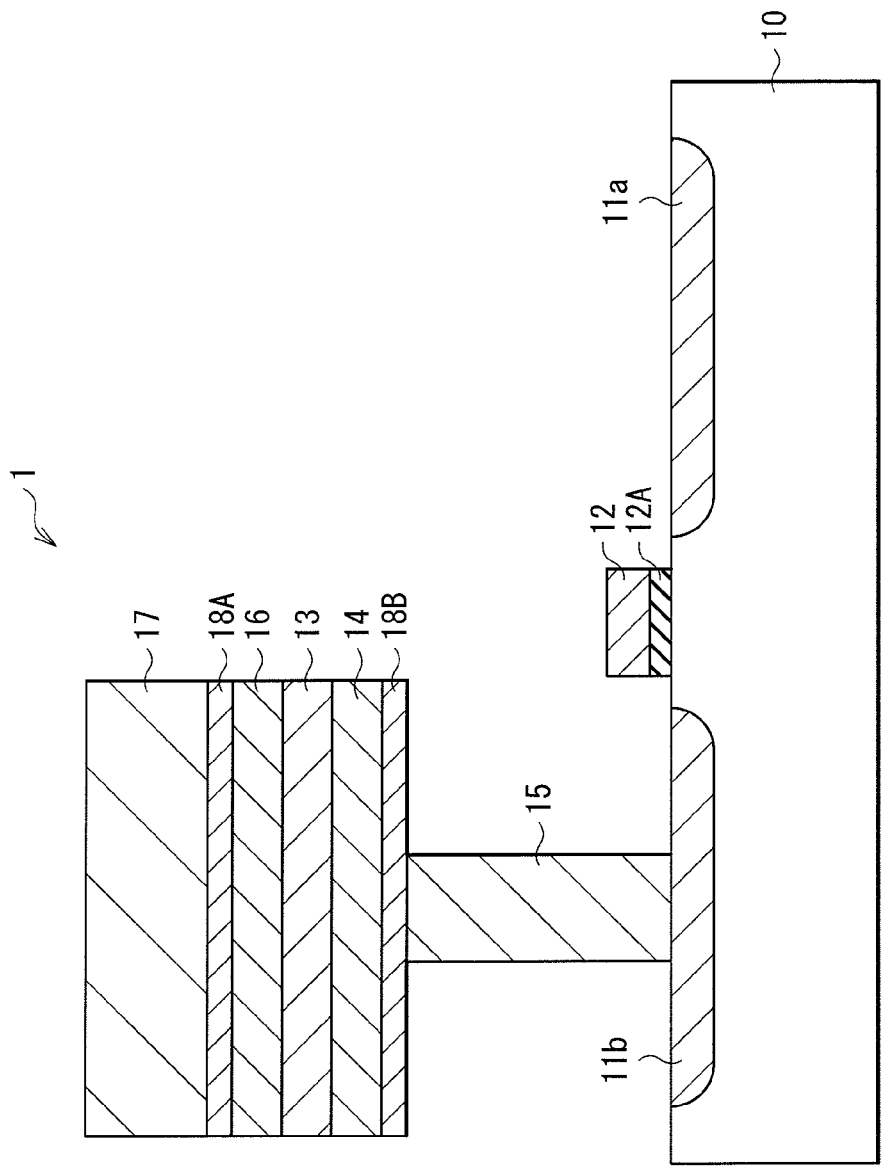
FIG. 3 is a cross section illustrating the configuration of a memory device according to modification 1.

As illustrated in FIG. 3, a heat barrier layer 18A having a thickness of 2 nm or less may be provided between the solid electrolyte layer 16 and the top electrode 17, and a heat barrier layer 18B having a thickness of 2 nm or less may be provided between the semiconductor layer 14 and the bottom electrode 15. As the material of the heat barrier layers 18A and 18B, for example, titanium oxide ($Ti_2O_3$), alumina ($Al_2O_3$), silica ($SiO_2$), or the like may be used. When the movable ions are accelerated by the electric field while increasing the temperature of the amorphous semiconductor layer 13, the time of the movement between the solid electrolyte layer 16 and the amorphous semiconductor layer 13 can be shortened. The heat barrier layers 18A and 18B function as thermal barrier layers and contribute to temperature rise in the amorphous semiconductor layer 13 and the solid electrolyte layer 16. On the other hand, since the thickness of the heat barrier layers 18A and 18B is 2 nm or less, there is no possibility that the electrical influence is exerted on the memory device 1 by the tunnel effect.

Second Embodiment

Figure 4:
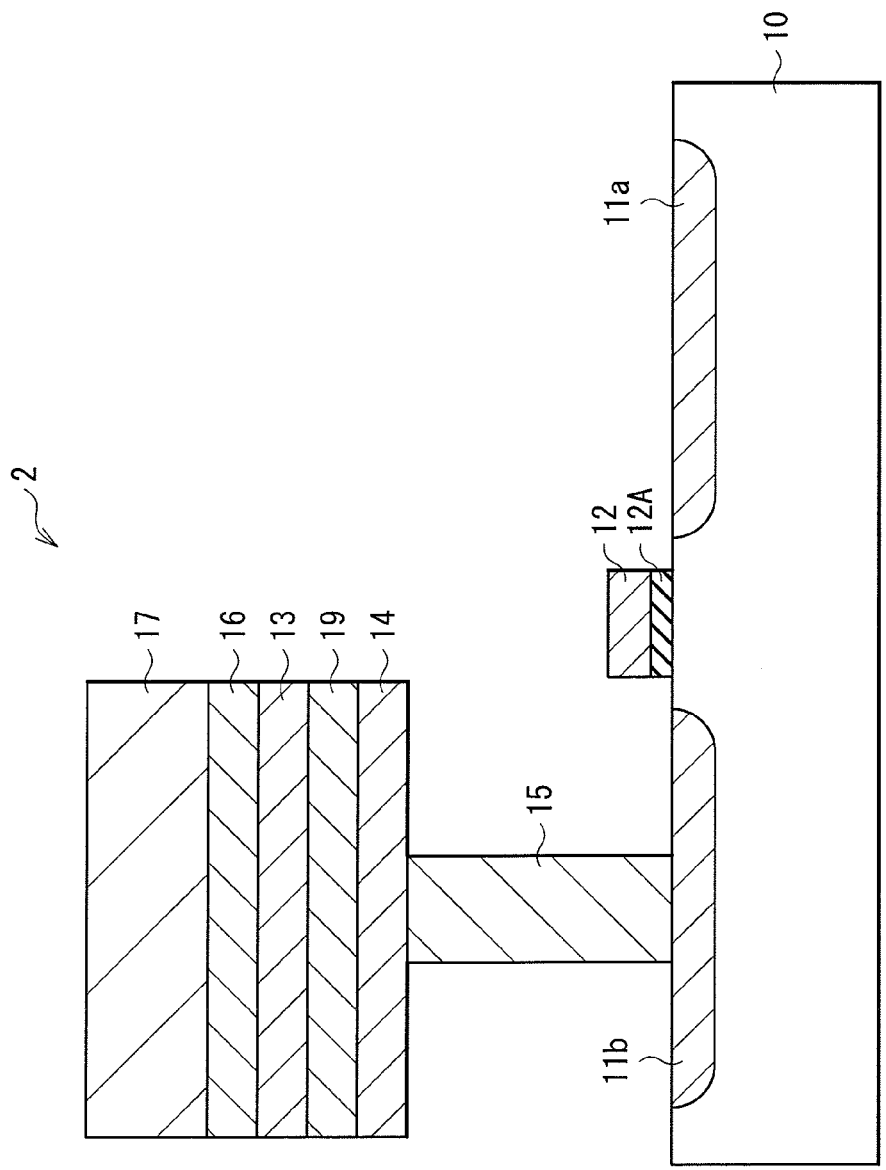
FIG. 4 is a cross section illustrating the configuration of a memory device according to a second embodiment of the present disclosure.

FIG. 4 illustrates a sectional configuration of a memory device 2 according to a second embodiment of the present disclosure. In the following, the same reference numerals are designated to the same components as those in the first embodiment and their description will not be repeated. The memory device 2 has a configuration similar to that of the memory device 1 of the first embodiment except that an intrinsic semiconductor layer 19 having a thickness of 2 nm or larger is provided between the amorphous semiconductor layer 13 and the semiconductor layer 14 and can be manufactured similarly.

In the embodiment, since the intrinsic semiconductor layer 19 having a thickness of 2 nm or larger is provided between the amorphous semiconductor layer 13 and the semiconductor layer 14, the adhesion between the amorphous semiconductor layer 13 and the semiconductor layer 14 can be improved. For the intrinsic semiconductor layer 19, for example, silicon intrinsic semiconductor can be used.

Preferably, the intrinsic semiconductor layer 19 is made of a crystal phase semiconductor which is more dense than that of the semiconductor layer 14 to prevent the hetero junction interface from being contaminated by the movable ions diffused from the amorphous semiconductor layer 13.

The action and effect of the memory device 2 of the embodiment are similar to those of the memory device 1 of the first embodiment. By providing the intrinsic semiconductor layer 19, particularly, the adhesion of the interface between the amorphous semiconductor layer 13 and the semiconductor layer 14 is improved, and contamination of the hetero junction interface is prevented.

(Modification 2)

Figure 5:
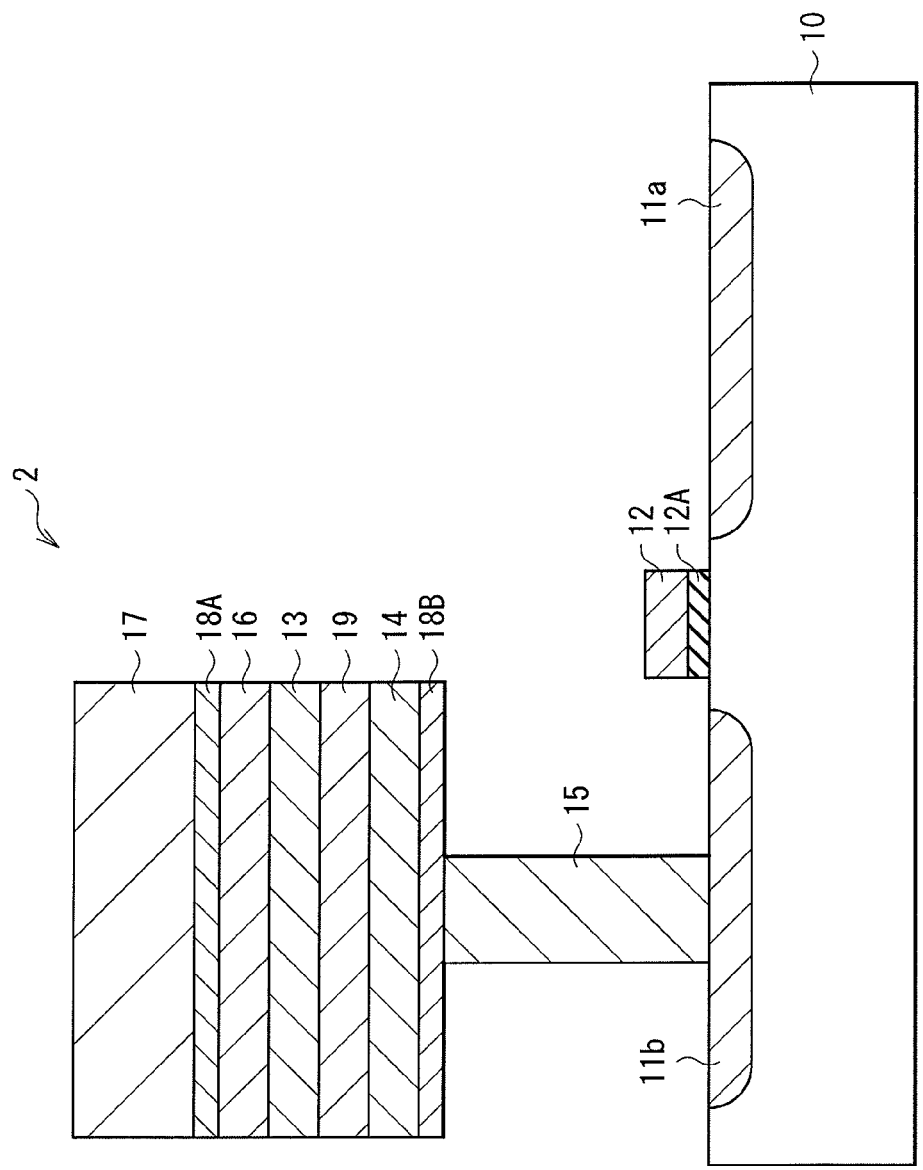
FIG. 5 is a cross section illustrating the configuration of a memory device according to modification 2.

Also in the second embodiment, as illustrated in FIG. 5, the heat barrier layer 18A having a thickness of 2 nm or less may be provided between the solid electrolyte layer 16 and the top electrode 17 of the memory device 2, and the heat barrier layer 18B having a thickness of 2 nm or less may be provided between the semiconductor layer 14 and the bottom electrode 15. The function of the heat barrier layers 18A and 18B is similar to that of the heat barrier layers 18A and 18B of the modification 1.

Although the present disclosure has been described above by the embodiments and the modifications, the disclosure is not limited to the embodiments and the modifications but may be variously modified. For example, a diode may be used as the MOS transistor Tr, and a cheap memory configuration may be also employed without using a transistor and a diode.

Although the configurations of the memory devices 1 and 2 have been described concretely as examples in the foregoing first and second embodiments and their modifications, other layers may be further provided.

Further, the materials of the layers, the film forming method, the film forming conditions, and the like described in the foregoing embodiments and modifications are not limited. Other materials and other film forming methods may be also employed. For example, when the trap concentration is made exceed the donor atom concentration or the acceptor atom concentration by movement of movable ions, an oxide semiconductor or a nitride semiconductor may be used for the amorphous semiconductor layer 13.

Further, although the writing/erasing operation of the memory devices 1 and 2 has been described in the foregoing embodiments and the like, the present disclosure is obviously applied to a memory performing only writing operation.

The present disclosure contains subject matter related to that disclosed in Japanese Priority Patent Application JP 2010-180489 filed in the Japanese Patent Office on Aug. 11, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
   first and second electrodes;
   a semiconductor layer of a first conduction type between the first electrode and the second electrode;
   a solid electrolyte layer containing movable ions between the second electrode and the semiconductor layer; and
   an amorphous semiconductor layer of a second conduction type between the semiconductor layer and the solid electrolyte layer and in contact with the solid electrolyte layer, at the time of application of voltage to the first and second electrodes, the amorphous semiconductor layer reversibly changing to the first conduction type,
   wherein,
   trap concentration in the amorphous semiconductor layer is equal to or higher than either donor concentration or acceptor concentration.

2. The memory device according to claim 1, wherein by movement of movable ions between the solid electrolyte layer and the amorphous semiconductor layer at the time of application of voltage to the first and second electrodes, the conduction type of the amorphous semiconductor layer changes.

3. The memory device according to claim 1, further comprising an intrinsic semiconductor layer having a thickness of 2 nm or larger provided between the amorphous semiconductor layer and the semiconductor layer.

4. The memory device according to claim 1, wherein temperature at which the movable ions contained in the solid electrolyte layer become movable is 300K or higher, and
concentration of the movable ions in the solid electrolyte layer at 300K is equal to or less than trap concentration of the amorphous semiconductor layer.

5. The memory device according to claim 1, wherein concentration of impurity atoms in the semiconductor layer is equal to or less than trap concentration of the amorphous semiconductor layer.

6. The memory device according to claim 1, further comprising a heat barrier layer provided one or both of a portion between the first electrode and the semiconductor layer and a portion between the second electrode and the solid electrolyte layer.

7. The memory device according to claim 1, wherein the amorphous semiconductor layer contains a chalcogen element (S, Se, Te) or an alloy of the chalcogen element.

8. The memory device according to claim 7, wherein the amorphous semiconductor layer is made of $Ge_X Te_{100-X}$ ($10 \leq X \leq 60$).

9. A memory device comprising:
   first and second electrodes;
   a semiconductor layer of a first conduction type between the first electrode and the second electrode;
   a solid electrolyte layer containing movable ions between the second electrode and the semiconductor layer;
   an amorphous semiconductor layer of a second conduction type between the semiconductor layer and the solid electrolyte layer and in contact with the solid electrolyte layer, at the time of application of voltage to the first and second electrodes, the amorphous semiconductor layer reversibly changing to the first conduction type; and
   an intrinsic semiconductor layer having a thickness of 2 nm or larger provided between the amorphous semiconductor layer and the semiconductor layer.

10. A memory device comprising:
    first and second electrodes;
    a semiconductor layer of a first conduction type between the first electrode and the second electrode;
    a solid electrolyte layer containing movable ions between the second electrode and the semiconductor layer; and
    an amorphous semiconductor layer of a second conduction type between the semiconductor layer and the solid electrolyte layer and in contact with the solid electrolyte layer, at the time of application of voltage to the first and second electrodes, the amorphous semiconductor layer reversibly changing to the first conduction type,
    wherein,
    temperature at which the movable ions contained in the solid electrolyte layer become movable is 300K or higher, and
    concentration of the movable ions in the solid electrolyte layer at 300K is equal to or less than trap concentration of the amorphous semiconductor layer.

11. A memory device comprising:
    first and second electrodes;
    a semiconductor layer of a first conduction type between the first electrode and the second electrode;

a solid electrolyte layer containing movable ions between the second electrode and the semiconductor layer; and an amorphous semiconductor layer of a second conduction type between the semiconductor layer and the solid electrolyte layer and in contact with the solid electrolyte layer, at the time of application of voltage to the first and second electrodes, the amorphous semiconductor layer reversibly changing to the first conduction type, wherein, concentration of impurity atoms in the semiconductor layer is equal to or less than trap concentration of the amorphous semiconductor layer.

12. A memory device comprising:

first and second electrodes;

a semiconductor layer of a first conduction type between the first electrode and the second electrode;

a solid electrolyte layer containing movable ions between the second electrode and the semiconductor layer;

an amorphous semiconductor layer of a second conduction type between the semiconductor layer and the solid electrolyte layer and in contact with the solid electrolyte layer, at the time of application of voltage to the first and second electrodes, the amorphous semiconductor layer reversibly changing to the first conduction type; and a heat barrier layer provided one or both of a portion between the first electrode and the semiconductor layer and a portion between the second electrode and the solid electrolyte layer.

* * * * *